US007071087B2

(12) United States Patent
Yang et al.

(10) Patent No.: US 7,071,087 B2
(45) Date of Patent: Jul. 4, 2006

(54) TECHNIQUE TO GROW HIGH QUALITY ZNSE EPITAXY LAYER ON SI SUBSTRATE

(75) Inventors: Tsung-Hsi Yang, Yunlin (TW); Chung-Liang Lee, Taipei (TW); Chu-Shou Yang, Taoyuan (TW); Guangli Luo, Hsinchu (TW); Wu-Ching Chou, Hsinchu (TW); Chun-Yen Chang, Hsinchu (TW); Tsung-Yeh Yang, Yunlin (TW)

(73) Assignee: Witty Mate Corporation, Hsi-chih (TW)

( * ) Notice: Subject to any disclaimer, the term of this patent is extended or adjusted under 35 U.S.C. 154(b) by 231 days.

(21) Appl. No.: 10/859,764

(22) Filed: Jun. 3, 2004

(65) Prior Publication Data

US 2005/0233495 A1    Oct. 20, 2005

(30) Foreign Application Priority Data

Apr. 14, 2004    (TW) .............................. 93110357 A

(51) Int. Cl.
*H01L 21/28* (2006.01)
*H01L 21/3205* (2006.01)
(52) U.S. Cl. .................................... 438/603
(58) Field of Classification Search ............... 438/603; 257/E33.019
See application file for complete search history.

(56) References Cited

U.S. PATENT DOCUMENTS 6,107,653 A * 8/2000 Fitzgerald .................... 257/191
6,291,321 B1 * 9/2001 Fitzgerald .................... 438/494

OTHER PUBLICATIONS

R.D Bringans et al, Use of ZnSe as an interlayer for GaAs growth on Si, Dec. 12, 1992, American Institute of Physics, Appl. Phys. Lett. 61 (2) Jul. 13, 1992, pp. 195-197.*
"Characterization of Znse/Ge material growth ù sing the atomic force microscope"□□By: Ibrahim M. Abdel-Motaleg, S. Pal. P. Desai□□Journal of Crystal Growth 2 17 (2000) pp. 366-370□□Apr. 19, 2000.*

(Continued)

*Primary Examiner*—W. David Coleman
*Assistant Examiner*—Nicholas Tobergte
(74) *Attorney, Agent, or Firm*—Bucknam and Archer

(57) ABSTRACT

A technique to grow high quality and large area ZnSe layer on Si substrate is provided, comprising growing $Ge_xSi_{1-x}$/ Ge epitaxial layers on Si substrate by using ultra-high vacuum chemical vapor deposition (UHVCVD), and finally growing a ZnSe film on top Ge buffer layers.

Two concepts are applied in the process of this invention, the first one is to block the dislocations generated from $Ge_xSi_{1-x}$ epitaxial layers and to terminate the propagated upward dislocations by using strained interfaces, accordingly the dislocation density of ZnSe layer is greatly reduced and the surface roughness is improved; the second concept is to solve the problems of anti-phase domain due to growth of polar materials on non-polar material using off-cut angle Si substrate, and that is free from diffusion problems between different atoms while generally growing ZnSe layers on Si substrate.

26 Claims, 2 Drawing Sheets

OTHER PUBLICATIONS

"Impact of GaAs buffer thickness on electronic quality of GaAs grown on graded Ge/GeSi/Si substrates" By: J.A. Carlin and S.A. Ringel (Dept. of Elec. Enga, The Ohio St. Univ.), E.A. Fitzgerald (Massachusetts Institute of Technology), M. Bulsara (Amberwave Systems Corp . . . B.M. Keyes (Nat'l Renewable Energy Lab.) Applied Physics Letters, vol. 7.*

"Characterization of ZnSe/Ge material growth using the atomic force microscope" By: Ibrahim M. Abdel-Motaleg, S. Pal, P. Desai Journal of Crystal Growth 217 (2000) pp. 366-370 Apr. 19, 2000.

"Epitaxial growth of high quality ZnSe on Si substrates by molecular beam epitaxy and application to dc electroluminescent cells" By: Naoki Mino, Masakazu Kobayashi, Makoto Konagai, Kiyoshi Takahashi Dept. of Physical Electronics, Tokyo Institute of Technology J. Appl. Phys. vol. 58, No. 2 pp. 793-796 Mar. 27, 1985.

"Growth and characterization of ZnSe on Si by atomic layer epitaxy" By: M. Yokoyama, N.T. Chen, H.Y. Ueng Dept. of Electrical Engineering, National Cheng Kung University Journal of Crystal Growth 212 (2000) pp. 97-102 Dec. 7, 1999.

"Molecular Beam Epitaxial Growth of ZnSe Layers on GaAs and Si Substrates" By: M. López-López[a], V.H. Méndez-Garcìa[a], Meléndez-Lira[a], J. Luyo-Alvarado[a], M. Tamura[a], K. Momose[b], H. Yonezu[b] a. Physics Dept . . . Centro de Investigación y de Estudios Avanzados del IPN b. Dept. of Electrical and Electronic Engineering, Toyohashi Univ. of Technology Phys. stat. sol. (b) 220, pp. 99-109 2000.

"Impact of GaAs buffer thickness on electronic quality of GaAs grown on graded Ge/GeSi/Si substrates" By: J.A. Carlin and S.A. Ringel (Dept. of Elec. Eng., The Ohio St. Univ.), E.A. Fitzgerald (Massachusetts Institute of Technology), M. Bulsara (Amberwave Systems Corp., B.M. Keyes (Nat'l Renewable Energy Lab.) Applied Physics Letters, vol. 76, No. 14 Apr. 3, 2000.

* cited by examiner

TECHNIQUE TO GROW HIGH QUALITY ZNSE EPITAXY LAYER ON SI SUBSTRATE

FIELD OF THE INVENTION

The present invention relates to a high productive and low-cost technique of heteroepitaxial growth of high-quality and large-area films on Si substrates with lattice mismatch or thermal mismatch; more particularly, to a process of growing II–VI groups materials, for example, ZnSe, on Si substrates. There two techniques are presented in this invention for growth high quality ZnSe on Si. First is to reduce the dislocation density in the ZnSe layers, second is to suppress the impurity inter-diffusion during the growth process by using off-cut Si substrates. The present technique and process are widely applicable to the manufacture of compound semiconductor elements, solar cells and light-emitting diodes, and are usable in integration of IV group and III–V group materials.

DESCRIPTION OF THE PRIOR ART

The use of II–VI groups as photoelectric materials, for example, light-emitting diodes, is interested due to their wide band-gap, wherein ZnSe becomes the objective of researchers in industries and academia by having an band-gap of 2.67 e-Volt, and an emitting wavelength of 463 nm which belongs to blue light spectrum and is the kind of short wavelength difficultly obtained with general III–V groups materials.

Currently, the epitaxy of ZnSe compound semiconductors is based on well-located growth on GaAs substrates, the epitaxy thereof is to grow ZnSe crystalline films on lattice matched GaAs by using the metal organic chemical vapor deposition (MOCVD) or molecular beam epitaxy (MBE), and the growing methods are conducted in two ways: (1) to grow Zn or Se buffer layers; (2) to grow $Al_xGa_{1-x}$ As or $In_xGa_{1-x}$ As buffer layers between ZnSe epitaxial layers and GaAs substrates.

However, these growing techniques come with the following disadvantages: (1) single-crystal GaAs substrates are high-cost with small area (currently commonly used are 3-inch and 4-inch), and their thermal conductivities are too small to likely impact the application of ZnSe compound semiconductors; (2) during the growing of ZnSe on GaAs, if the growing temperature is too high or which processes in high temperature process for long time, that cause As or/and Ga atoms gradually out-diffusion form GaAs substrates to ZnSe epitaxial layers as sources of dopants, consequently, the thickness and concentration of the doping profiles are not able to control precisely.

An alternative to replace the above-described GaAs substrates is to use Ge substrates or Si substrates. However, Ge substrates are of poor mechanical properties making them brittle, and only small area (currently commonly used is 2-inch) is available, so for these reasons the difficulty in processing is increased; besides, the cost of single-crystal Ge substrates is too high, resulting constantly high cost of ZnSe compound semiconductors. A potential alternative is a ZnSe blue light diode, developed by Japan Matsushita Corporation, with brightness of 4 times more than conventionally known, its main progress is to improve the resistivity and to use Si for substrates, so that the process is greatly simplified and the cost for growing ZnSe epitaxial layer is reduced. However, if Si is used for start substrates, then an existing problem is the difference of lattice constants, about 4.3%, between Si substrate and ZnSe which form a large amount of threading dislocation in the ZnSe epitaxial layers and lower the single-crystal quality of epitaxial films; in addition, due to polar epitaxial layers (II–VI groups) are grown on non-polar substrates (IV group), ZnSe is grown directly on Si substrates that induced the anti-phase domains, resulting a higher technical difficulty for this method.

The techniques to improve the above-described growth of ZnSe crystalline films on Si substrates published in literatures include: (1) Use of atmospheric pressure—metal organic chemical vapor deposition (AP-MOCVD) to grow ZnSe on Ge substrates, in which Zn or Se is grown firstly as the buffer layers for ZnSe (Ibrahim M., Abdel-Motaleb, S. Pal, P. Desai, "Characterization of ZnSe/Ge material growth using the atomic force microscope", J. Crystal Growth 217 (2000) 366–370). (2) Direct growth of ZnSe on Si substrates comprising: to directly grow ZnSe on Si substrates using molecular beam epitaxay (Naoki Mino, Masakazu Kobayashi, Makoto Konagai, Kiyoshi Takahashi, "Epitaxial growth of high quality ZnSe on Si substrates by molecular beam epitaxy and application to dc electroluminescent cells", J. Appl. Phys. 58 (2), 15 Jul. 1985), to grow ZnSe using atomic layer epitaxy (M. Yokoyama, N. T. Chen, H. Y. Ueng, "Growth and characterization of ZnSe on Si by atomic layer epitaxy", J. Crystal Growth 212 (2000) 97–102), and to directly grow ZnSe on Si substrates with protection of Si surfaces using N-plasma technique before ZnSe growth (M. LÓPEZ-LÓPEZ, V. H. MÉNDEZ-GARCÍA, MELÉNDEZ-LIRA, J. LUYO-ALVARADO, M. TAMURA, K. MOMOSE, H. YONEZU, "Molecular Beam Epitaxial Growth of ZnSe Layers on GaAs and Si Substrates", Phys. Stat. Sol. (b) 220, 99 (2000)). There are significant disadvantages existing in all of the above ZnSe/Si epitaxial structures, i.e., high threading dislocation density is created due to lattice dislocation while directly growing ZnSe on Si substrates, which can not be improved only by changing of epitaxy methods.

The extensive study by Inventor of this application has lead to a new technique by use of growing Ge epitaxital buffer layers, which uses localization to control the threading dislocation and to produce strained interfaces for terminating the upward propagation of the threading dislocation, and uses off-cut angle Si substrates to eliminate the problems on growing ZnSe/Si epitaxy. Besides, the off-cut Si substrates also are used to reduce the threading dislocation density with suppressed the impurity inter-diffusion.

SUMMARY OF THE INVENTION

The present process allows to epitaxitally grow high-quality and large-area heterogeneous epitaxital ZnSe materials on Si substrates, which are widely applicable to devices structures as light-emitting diodes, lasers, solar cells, etc. With the present process, ZnSe epitaxital layers with high optic-electrical property, low threading dislocation density and smooth surface are obtained. The production process thereof is simple and low-cost without the disadvantage of out-diffusion of atoms during the epitaxy process, and is able to ideally solve the problems encountered in this art.

The objects, advantages and features of the present invention are disclosed in the description hereinafter. Those skilled in this art will clearly understand these and related objects, advantages and features of the present invention, alternatively, these and related objects, advantages and features concretely specified and implemented in the claims described hereinafter, after reading the description hereinafter.

In order to complete the achievement of epitaxitally growing high-quality ZnSe epitaxital layers on Si substrates, which are usable as substrates for growing II–VI groups, and are applicable to devices structures like light-emitting diodes (blue, green or white lights), lasers, solar cells, etc., the present invention provides a process to obtain large-area, high-quality ZnSe epitaxital layers, which can be usable as substrates for growing light-emitting diodes, for example, ZnSe light-emitting diodes which emit blue, green or white lights, or adjustable absorptive light detectors. The above applications are based on the selection of Ge/SiGe/Si (IV group) with compatibility to the lattices and slight thermal expansion coefficient difference as substrate materials or buffer layers (in other words, materials with compatibility to the lattices and slight thermal expansion coefficiency difference, which include but not limit to II–VI groups heterogeneous epitaxital materials as ZnMgSe, ZnTe, ZnSSe, InSe, CdSe, ZnS, GaSe, etc, in addition to ZnSe). The advantages of the present invention on semiconductor element production process are: to solve the problems like brittle Ge substrates due to their poor mechanical properties, difficult processing works, and higher cost of single-crystal Ge substrates, by using Si as substrate materials (also, Ge is used as buffer layer materials), resulting a greatly simplified production process and reduced cost for growing ZnSe crystalline. The present process is new and of market potential. However, due to the difference of lattice constants, about 4.3%, between Si and Ge and difference between thermal expansion coefficiencies for these materials, a large amount of threading dislocation are created inside SiGe epitaxital layers to lower the single-crystal quality of epitaxital films, resulting rough surfaces of the films.

Figure 1:
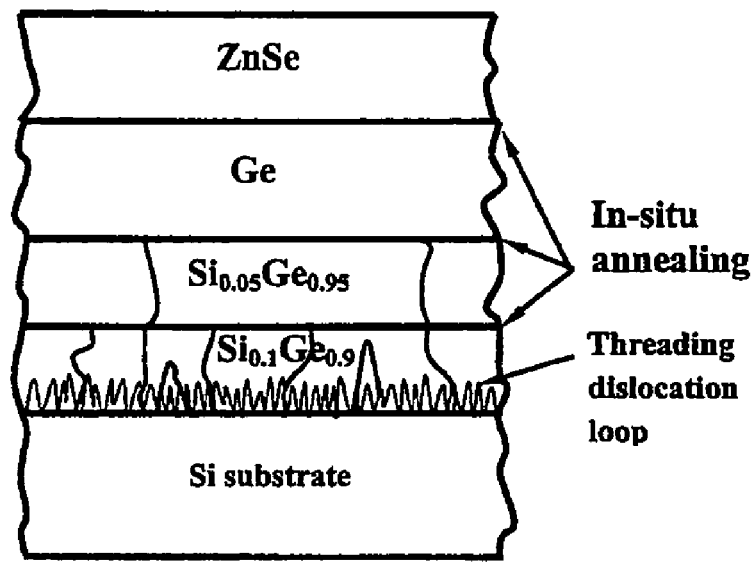
FIG. 1 is a scheme showing the mechanism using the threading dislocation control way in the present invention.
Figure 2:
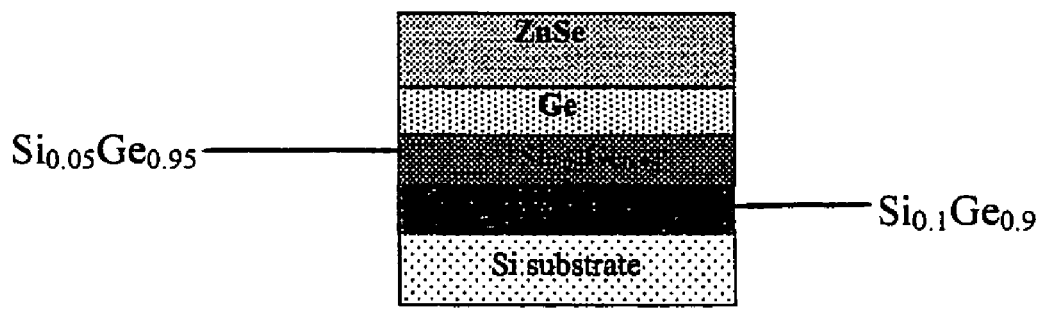
FIG. 2 is a scheme showing the integration of II–IV groups and Si materials in the present invention.

As shown by the structure in FIG. 1, the present invention provides a Ge epitaxital layer between Si and Ge layers as buffer layer, which can greatly reduce the threading dislocation density, thus on the buffer layers with compatibility to the lattices are grown, which include but not limit to II–VI groups heterogeneous epitaxital materials as ZnMgSe, ZnTe, ZnSSe, InSe, CdSe, ZnS, GaSe, etc, in addition to ZnSe. The finished substrate is shown in FIG. 2. With the substrates, devices as white/blue/green light-emitting diodes (LED), visible-sensitivity emitter bipolar transistors and solar cells are manufactured.

In the epitaxital growing method provided by the present invention, the principle thereof is shown in FIG. 1, a large amount of linear dislocation are created on the first layer by using SiGe with Ge mole fraction of 90%, and the stress is completely released, then the second layer with higher Ge mole fraction and optionally the subsequent layers are deposited on the first layer, wherein the dislocations are localized at the interface between Si substrate and the first buffer layer, and the propagation of dislocations toward the second layer and optionally subsequent layers are terminated by using strained interfaces, so that the problems of high defect density and excessively large surface roughness are solved. In FIG. 1, the first SiGe epitaxital layer with Ge mole fraction of at least 70%, preferably 90%, is formed on Si substrate, resulting a large amount of threading dislocation; then a second SiGe epitaxital layer with higher Ge mole fraction, for example, 95%, and optionally a third SiGe epitaxital layer with Ge molar content higher than the second one, for example, 98%, or a pure Ge film, are formed. Ge mole fraction in the buffer layers are increased stepwise and the total thickness of epitaxital layers is controlled to be below 3.0 µm. The above-described Ge buffer layer epitaxy is grown by ultra-high vacuum chemical vapor deposition (UHVCVD), and eventually a ZnSe epitaxital layer is grown on the Ge buffer layer by molecular beam epitaxy (MBE).

The technical concept of using $Si_{1-x}Ge_x$ as buffer layers grown on Si substrates is disclosed by E. A. Fitzgerald et al. in "Impact of GaAs buffer thickness on electronic quality of GaAs grown on graded Ge/GeSi/Si substrate" (Applied Physic Letters, Vol. 76, No. 14, 3 Apr. 2000), which includes growing SiGe epitaxital layers with gradually changed Ge mole fraction on Si substrates, then conducting the epitaxy for GaAs layer on the top Ge layer by molecular beam epitaxy; wherein the technique of growing $Si_{1-x}Ge_x$ on Si substrates is firstly disclosed in U.S. Pat. Nos. 6,291,321 and 6,107,653. However, the present invention is significantly different from the prior art in concepts, techniques and objectives.

DETAILED DESCRIPTION OF THE INVENTION

Figure 3:
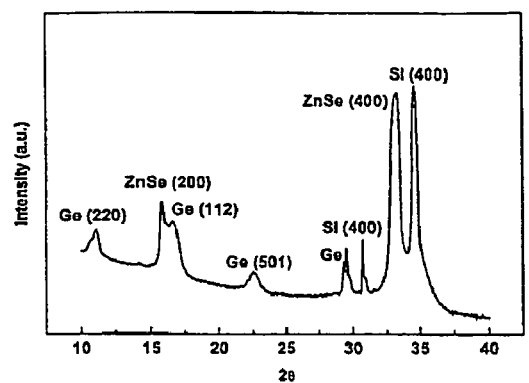
FIG. 3 is a ZnSe/SiGe/Si XRD analytical diagram showing the result of the implementation of the present process.
Figure 4:
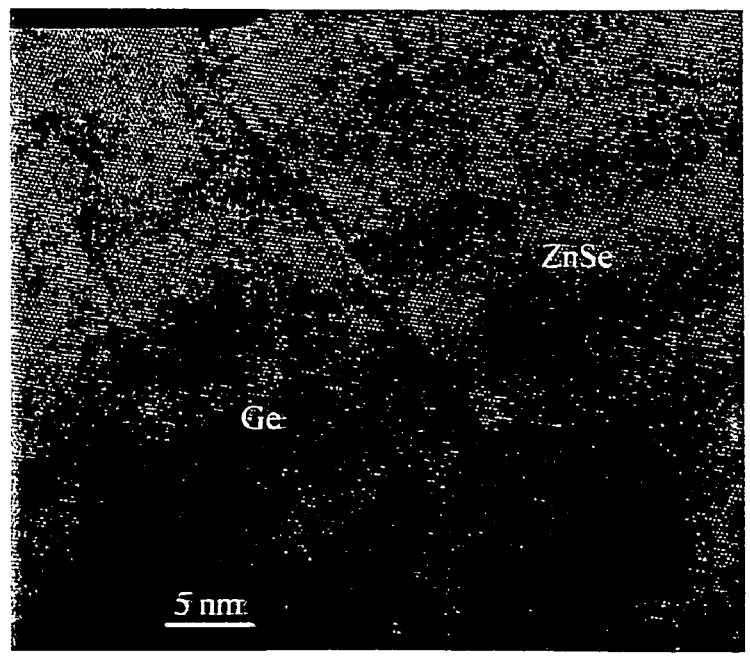
FIG. 4 is a ZnSe/Ge cross-sectional high-resolution transmission electronic microscopic image showing the result of the implementation of the present process.

The present epitaxy is characterized in, first, growing a SiGe epitaxital layer with high Ge mole fraction (for example, 0.5 to 0.8 µm of $Si_{0.1}Ge_{0.9}$) on an off-cut angle Si substrate, and using this layer to contain a large amount of threading dislocation created by lattice dislocation at the bottom of the layer and interfaces; then growing a second or third SiGe epitaxital layer with higher Ge mole fraction (for example, 0.5 to 0.8 µm of $Si_{0.05}Ge_{0.95}$, $Si_{0.02}Ge_{0.98}$), and using the strained interfaces formed between each layer to further terminate the threading dislocation not cleared off on the first layer and propagating upward, eventually growing up a Ge epitaxital layer with a total epitaxital thickness of only few µm, for example, below 3 µm. In the above-described process, a high temperature, i.e., 650 to 800° C., annealing treatment is performed in situ to each layer for 15 to 30 minutes, to further elevate Ge film. Finally, a ZnSe epitaxital layer is grown on the Ge buffer layer by molecular beam epitaxy, and an annealing treatment is performed at 350 to 450° C. for 15 to 30 minutes, to further elevate the epitaxital quality of ZnSe. As shown by sample ZnSe/Ge/$Ge_xSi_{1-x}$/Si XRD diagram obtained in accordance with the present invention in FIG. 3, ZnSe layer grown by using Ge/$Si_{1-x}Ge_x$ buffer layer is of good single-crystal quality. Also, as shown by sample ZnSe/Ge cross-sectional high-resolution transmission electronic microscopic image obtained in accordance with the present invention in FIG. 4, ZnSe atoms align regularly with good single-crystal quality, and no anti-phase domain due to polar problem is created. The obtained threading dislocation density of ZnSe film is $3\times10^6/cm^2$, and the surface roughness is 10–20 nm as observed by atomic force microscopy (AFM).

Next, the present epitaxy is also characterized in, the process of growing SiGe epitaxital layers on off-cut angle Si in the present invention being conducted by ultra-high vacuum chemical vapor deposition, which implements the growth of SiGe epitaxital layers by using high purity $SiH_4$, $GeH_4$ as growing gases under growing gas pressure of 20 to 100 mTorr at temperature ranging from 350 to 650° C., wherein the high Ge content of the first epitaxital layer, the second layer or the optional third layer is kept at specific operation condition, only the total proportion of Si and Ge in the growing gases is changed. The growing condition of ZnSe includes substrate temperature ranging from 200 to 350° C., Zn growing temperature of 295° C., Se growing temperature of 175° C. During growing, a layer of tens of Zn atoms is grown first, and then a ZnSe epitaxital layer with a given thickness is grown. This process is significantly different from conventional which grows ZnSe on non-off-cut angle Si substrates.

In the present invention, an off-cut angle Si substrate with smooth surfaces is used for growing heterogeneous structure, which is firstly cleaned by the standard cleaning procedure, then is immersed into 50 wt % hydrofluoric acid solution, and is treated at 750° C. before growing to remove intrinsic oxide layer; as the high temperature annealing treatment in situ between all epitaxital layer growing stages, it is performed at 750° C. for 0.25 to 0.5 hour to further reduce threading dislocation density and elevate Ge single-crystal quality. Additionally, after growing ZnSe, an annealing treatment is performed at 350° C. for 0.25 to 0.5 hour to further reduce threading dislocation density and elevate ZnGe single-crystal quality.

DETAILED DESCRIPTION OF PREFERRED EMBODIMENTS

The present invention discloses the following embodiments without limiting thereto.

A. Cleaning of Si Substrates (a) First, off-cut angle Si substrates with size of 3~6 inches were cleaned by standard cleaning procedure, and were immersed into 50 wt % hydrofluoric acid solution; (b) then they were allowed to dry with flowing nitrogen.

B. Epitaxital Growing of Ge/SiGe layer (a) The dried 3~6-inch off-cut angle Si substrates were passed into UHVCVD system, and were prebaked at 750° C. for about 10 minutes to remove surface oxide layer before growing, then the temperature was brought to 400° C., a 100-nm Si buffer layer was grown during the temperature lowering process, and a SiGe epitaxital layer was grown immediately after the temperature stabilized; (b) a first $Si_{0.1}Ge_{0.9}$ epitaxital layer with high Ge mole fraction was grown (to a thickness of 0.5 to 0.8 μm); (c) a second $Si_{0.05}Ge_{0.95}$ epitaxital layer with higher Ge mole fraction was grown (to a thickness of 0.5 to 0.8 μm); (d) a Ge epitaxital layer was grown to a thickness of 0.5 to 0.8 μm. During the above-described growing processes, a high temperature annealing treatment, which was conducted with hydrogen as annealing gas under pressure ranging from 5 to 20 mTorr at 700 to 750° C. for 0.25 to 0.5 hour, should be performed in situ to each single layer to further elevate the quality of Ge epitaxital layers.

In the above, the ultra-high vacuum chemical vapor deposition system was a quartz furnace tube provided with heating means, and the background vacuum was drawn to below $5 \times 10^{-8}$ Torr by molecular pump. The growing gases were $SiH_4$, $GeH_4$, and the growing flows were controlled by material flow controller, wherein the flow of $SiH_4$ was kept constant and only the supply flow of $GeH_4$ was adjusted under the specified operation condition comprising:

(1) Epitaxy temperature range: 350 to 650° C., preferably 400° C.;

(2) Growing gas pressure range: 20 to 100 mTorr, preferably 20 mTorr;

(3) Growing gases: high purity $SiH_4$, $GeH_4$ gases.

In the above, the further growing of the second or the third SiGe epitaxital layer with higher Ge mole fraction (i.e. $Si_{0.05}Ge_{0.95}$, $Si_{0.02}Ge_{0.98}$ of a layer thickness of at least 0.1 μm, preferably 0.5 to 0.8 μm, most preferably 0.8 μm) was used to further terminate the upward propagated dislocations not cleared off on the first layer by using the formed strained interfaces, and was subsequently grown up as a Ge layer with a given thickness, for example, 1 μm; in regard to the process of growing Ge epitaxital layers on Si substrates, the Ge mole fraction of the first layer was at least 70%, preferably between 70% and 90%; next, the Ge mole fraction of the second layer was between 80% and 98%, preferably 95%; the growth of the third layer was optionally performed, and the selected Ge mole fraction was between that of the second layer and pure Ge; the Ge mole fraction of the last layer was 100%. Since the lattice constants of Ge and ZnSe were almost matched, ZnSe could be grown on the top of Ge layers directly.

C. Cleaning of Ge/SiGe/Si substrates (a) First, Ge/SiGe/Si substrates with size of 3~6 inches were cleaned by standard cleaning procedure, the cleaning procedure included: Ge/SiGe/Si substrates were immersed into acetone and ultrasonic-vibrated for 5 minutes, then were taken out and placed into methanol and ultrasonic-vibrated for another 5 minutes; (b) then they were taken out and washed with deionized water (D. I. water) for 5 minutes, and were rinsed with 50 wt % hydrofluoric acid (HF) solution for 1 minute (or etched with $HNO_3/CH_3COOH/HF$ solution in a ration of 18:8:5 for 30 seconds instead), and subsequently were washed with deionized water for 5 minutes; (c) then they were allowed to dry with flowing nitrogen.

D. Epitaxital Growing of ZnSe layer (a) Ge/SiGe/Si substrates were loaded into MBE system and were pre-baked at 450~750° C. for about 10 minutes to remove surface oxide layer; (b) a Zn atom layer of tens angstroms thick was grown; (c) a ZnSe film of 1 to 3 μm thick was grown.

In the above, the background vacuum in the molecular beam epitaxy was drawn to below $1 \times 10^{-10}$ Torr. The solid atoms used in growing were Zn and Se, and the growing temperatures were 295° C. and 175° C., the substrate temperature was 200~350° C.

In regard to the best results of growing ZnSe on Ge/SiGe/Si substrates in the present invention, $Si_{0.1}Ge_{0.9}$ with Ge mole fraction of 90% was used as the initial SiGe epitaxital layer, which was grown to a thickness of 0.8 μm under growing pressure of 20 mTorr at growing temperature 400° C., then was annealed at 750° C. for 15 minutes; subsequently $Si_{0.05}Ge_{0.95}$ with Ge mole fraction of 95% was used as the second SiGe epitaxital layer, which was grown to a thickness of 0.8 μm under growing pressure of 20 mTorr at growing temperature 400° C., then was annealed at 750° C. for 15 minutes; furthermore 100% pure Ge was grown to a thickness of 1.0 μm under growing pressure of 20 mTorr at growing temperature 400° C., then was annealed at 750° C. for 15 minutes; eventually ZnSe epitaxital layer was grown to a thickness of 1 to 3 μm at 350° C. by molecular beam epitaxy.

What is claimed is:

1. A process to grow ZnSe film on Si substrate, comprising:
    (1) providing a clean flat Si substrate;
    (2) growing a first SiGe epitaxital layer with a given thickness to contain a large amount of threading dislocation created by lattice dislocation at the bottom of the layer and interfaces;
    (3) performing high temperature annealing to the first SiGe epitaxital layer in situ to reduce threading dislocation density;
    (4) growing a second and optionally a third SiGe epitaxital layer to terminate the threading dislocation propagating upward from the first epitaxital layer with the produced strained interfaces, and performing high temperature annealing in situ during both growing periods;
    (5) growing a pure Ge layer on the surface of the top epitaxital layer obtained in step (4); and
    (6) eventually growing a ZnSe layer on the pure Ge layer.

2. The process of claim 1, wherein the growing in steps (2) to (5) are conducted by ultra-high vacuum chemical vapor deposition under growing gas pressure of 20 to 100 mTorr at 350 to 650° C., and the growing in step (6) is conducted by molecular beam epitaxy; further, the high temperature annealing treatment is performed in situ at 700~750° C. for 0.25 to 0.5 hour.

3. The process of claim 1, wherein the Si substrate in step (1) is cleaned by the standard cleaning procedure, is rinsed with 10 wt % hydrofluoric acid solution, and is prebaked at 800° C. for 10 minutes to remove oxide layer.

4. The process of claim 1, wherein the first SiGe epitaxital layer is $Si_{0.1}Ge_{0.9}$ of at least 0.1 μm thick.

5. The process of claim 1, wherein the first SiGe epitaxital layer is $Si_{0.1}Ge_{0.9}$ of 0.5 to 0.8 μm thick.

6. The process of claim 1, wherein the second SiGe epitaxital layer is $Si_{0.05}Ge_{0.95}$ of at least 0.1 μm thick.

7. The process of claim 1, wherein the second SiGe epitaxital layer is $Si_{0.05}Ge_{0.95}$ of 0.5 to 0.8 μm thick.

8. The process of claim 1, wherein the optional third SiGe epitaxital layer is $Si_{0.02}Ge_{0.98}$ of at least 0.1 μm thick.

9. The process of claim 1, wherein the optional third SiGe epitaxital layer is $Si_{0.02}Ge_{0.98}$ of 0.5 to 0.8 μm thick.

10. The process of claim 1, wherein the Ge molar content of the first SiGe epitaxital layer is 70 to 90%.

11. The process of claim 1, wherein the Ge molar content of the second SiGe epitaxital layer is 80 to 95%.

12. The process of claim 2, wherein the epitaxy growing temperature is 400° C.

13. The process of claim 2, wherein the high temperature annealing is performed in situ at 750° C. for at least 15 minutes.

14. The process of claim 2, wherein the atmosphere used in the high temperature annealing in situ is hydrogen, and the annealing gas pressure is 20 mTorr.

15. A ZnSe epitaxital semiconductor structure, comprising a Si substrate, a first SiGe epitaxital layer with Ge mole fraction of at least 70%, a second SiGe epitaxital layer with higher Ge mole fraction, and optionally a third SiGe epitaxital layer with Ge mole fraction higher than that of the second SiGe epitaxital layer, a pure Ge layer, and a ZnSe layer as the top layer, characterized in: the first SiGe epitaxital layer can, at the bottom of the layer and interfaces, contain a large amount of threading dislocation created by lattice dislocation, and the second SiGe epitaxital layer and the optional third SiGe epitaxital layer can, with the strained interfaces thereof, terminate the threading dislocation propagating upward from the first epitaxital layer.

16. A ZnSe epitaxital semiconductor structure, comprising a Si substrate, a first SiGe epitaxital layer with Ge mole fraction of at least 70%, a second SiGe epitaxital layer with higher Ge mole fraction, and optionally a third SiGe epitaxital layer with Ge mole fraction higher than that of the second SiGe epitaxital layer, a pure Ge layer, and a ZnSe layer as the top layer, characterized in: the Ge mole fractions in the SiGe epitaxital layers are increased stepwise, and the total thickness of epitaxital layers, excluding ZnSe layer, is controlled to be below 3.0 μm.

17. A ZnSe epitaxital semiconductor structure, comprising a Si substrate, a first SiGe epitaxital layer with Ge mole fraction of at least 70%, a second SiGe epitaxital layer with higher Ge mole fraction, and optionally a third SiGe epitaxital layer with Ge mole fraction higher than that of the second SiGe epitaxital layer, a pure Ge layer, and a ZnSe layer as the top layer, characterized in: the threading dislocation density is controlled to be below $10^6/cm^2$ by process as described in claim 1.

18. A structure as described in claim 15, wherein ZnSe layer can be replaced by III–V groups heterogeneous epitaxital materials selected from the group consisting of ZnMgSe, ZnTe, ZnSSe, InSe, CdSe, ZnS, GaSe.

19. A structure as described in claim 15, which is applicable to the manufacture of elements as white/blue/green light-emitting diodes (LED), visible-sensitivity emitter bipolar transistors and solar cells.

20. A structure as described in claim 15, which is usable as chips of III–IV groups materials and in the integration of chips of III–V groups and IV group materials.

21. A structure as described in claim 16, wherein ZnSe layer can be replaced by III–V groups heterogeneous epitaxital materials selected from the group consisting of ZnMgSe, ZnTe, ZnSSe, InSe, CdSe, ZnS, GaSe.

22. A structure as described in claim 17, wherein ZnSe layer can be replaced by III–V groups heterogeneous epitaxital materials selected from the group consisting of ZnMgSe, ZnTe, ZnSSe, InSe, CdSe, ZnS, GaSe.

23. A structure as described in claim 16, which is applicable to the manufacture of elements as white/blue/green light-emitting diodes (LED), visible-sensitivity emitter bipolar transistors and solar cells.

24. A structure as described in claim 17, which is applicable to the manufacture of elements as white/blue/green light-emitting diodes (LED), visible-sensitivity emitter bipolar transistors and solar cells.

25. A structure as described in claim 16, which is usable as chips of III–IV groups materials and in the integration of chips of III–V groups and IV group materials.

26. A structure as described in claim 17, which is usable as chips of III–IV groups materials and in the integration of chips of III–V groups and IV group materials.

* * * * *